(12) United States Patent
Vlaiko et al.

(10) Patent No.: US 11,675,534 B2
(45) Date of Patent: Jun. 13, 2023

(54) TOGGLE MODE (TM) CODING WITH CIRCUIT BOUNDED ARRAY MEMORY

(71) Applicant: Western Digital Technologies, Inc., San Jose, CA (US)

(72) Inventors: Julian Vlaiko, Kfar Saba, IL (US); Idan Alrod, Herzliya (IL); Tien-Chien Kuo, Sunnyvale, CA (US); Nimrod Hermesh, Mazkeret Batia (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/970,221

(22) Filed: Oct. 20, 2022

(65) Prior Publication Data

US 2023/0043050 A1 Feb. 9, 2023

Related U.S. Application Data

(62) Division of application No. 17/314,374, filed on May 7, 2021, now Pat. No. 11,494,126.

(51) Int. Cl.
*G06F 3/06* (2006.01)

(52) U.S. Cl.
CPC .......... *G06F 3/0659* (2013.01); *G06F 3/0604* (2013.01); *G06F 3/0634* (2013.01); *G06F 3/0658* (2013.01); *G06F 3/0679* (2013.01)

(58) Field of Classification Search
CPC ....... G06F 3/06++; G11C 16/26; G11C 16/28; G11C 29/021; G11C 29/42; G11C 29/44;
See application file for complete search history.

(56) References Cited

U.S. PATENT DOCUMENTS 10,861,508 B1 12/2020 Mathur et al.
2015/0229325 A1 8/2015 Hollis
2018/0277175 A1* 9/2018 Kondo et al. ........ G11C 7/1096
(Continued)

OTHER PUBLICATIONS

Jedec Standard, Nano Flash Interface Interoperability, JESD230, Oct. 2012, Jedec Solid State Technology Association, Jedec, ONFI. (Year: 2012).
N. Shibata et al., A 19nm 112.8mm2 64Gb multi-level flash memory with 400Mb/s/pin 1.8V Toggle Mode interface, 2012 IEEE International Solid-State Circuits Conference, 2012, pp. 422-024, doi: 10 .1109/ISSCC .2012. 6177073. (Year: 2012).
(Continued)

*Primary Examiner* — Khoa D Doan
(74) *Attorney, Agent, or Firm* — Patterson + Sheridan, LLP; Steven H. VerSteeg

(57) ABSTRACT

A data storage device includes a memory device and a controller coupled to the memory device. The controller is configured to receive a command, such as from a host device, to write data to the memory device, perform toggle mode (TM) encoding on the data, and send the TM encoded data to the memory device. The memory device is configured to receive the TM encoded data, decode the TM encoded data, and write the decoded data to a location within the memory device. The memory device is further configured to receive a read command to read data from a location within the memory device, read the data, TM encode the data, and send the TM encoded data to the controller. The controller is configured to receive and decode the TM encoded data, and send the decoded data to a host device.

20 Claims, 7 Drawing Sheets

(56) References Cited

U.S. PATENT DOCUMENTS

| | | |
|---|---|---|
| 2018/0293128 A1 | 10/2018 | Dono et al. |
| 2021/0081133 A1* | 3/2021 | Higashi ............... G06F 3/0653 |
| 2021/0377080 A1* | 12/2021 | Park et al. ............. H04L 25/14 |
| 2022/0035758 A1 | 2/2022 | Hanna et al. |

OTHER PUBLICATIONS

D. Lee, M. O'Connor and N. Chatterjee, "Reducing Data Transfer Energy by Exploiting Similarity within a Data Transaction," 2018 IEEE International Symposium on High Performance Computer Architecture (HPCA), Vienna, Austria, 2018, pp. 40-51, doi: 10.1109 /HPCA.2018.00014. (Year: 2018).*

J. Xu, D. Feng, Y. Hua, W. Tong, J. Liu and C. Li, "Extending the lifetime of NVMs with compression," 2018 Design, Automation & Test in Europe Conference & Exhibition (Date), 2018, pp. 1604-1609, doi: 10.23919/ Date-2018.8342271. (Year: 2018).

\* cited by examiner

TOGGLE MODE (TM) CODING WITH CIRCUIT BOUNDED ARRAY MEMORY

CROSS REFERENCE TO RELATED APPLICATIONS

This application is a divisional of co-pending U.S. Pat. Application Serial No. 17/314,374, filed May 7, 2021. The aforementioned related patent application is herein incorporated by reference.

BACKGROUND OF THE DISCLOSURE

Field of the Disclosure

Embodiments of the present disclosure generally relate to data storage devices, such as solid state drives (SSDs), and relocating data within a data storage device.

Description of the Related Art

In data storage, data is transferred between a host device having a host controller and a memory device having a memory controller and a memory array. That is, the memory device has its own controller (typically a CMOS chip) coupled to the memory array. Further, the memory device may have a Circuit Bounded Array (CbA) architecture. In the CbA architecture, in addition to the memory controller chip, separate control dies (called CbA dies) are bonded to each of the dies that make up the memory array, e.g., NAND dies, so that each NAND die has its own dedicated control logic for operating on data being stored and retrieved from that particular NAND die.

The toggle mode (TM) data rate and power consumption characteristics of the memory controller to memory array interaction affect the performance of the data storage device. The TM data rate is linked to the input/output (IO) performance and the throughput of the transfer between the memory controller and the memory array. However, high TM rates are challenging to achieve due to both signal intensity and power consumption. As a result, limits on power consumption and thermal capacity affect the data storage device performance.

In communication systems, data may be shaped in order to reduce the number of switches between 0s and 1s (and vice-versa). For example, double data rate (DDR) data bus inversion may utilize data shaping. However, data shaping is not utilized in SSDs between the memory controller and memory dies since the data is scrambled and randomized before being programmed to the memory dies. Long series of 0s and 1s are not preferable data patterns for programming performance and data retention.

Thus, there is a need in the art for improved data shaping for data being transferred between the memory controller and memory dies.

SUMMARY OF THE DISCLOSURE

The present disclosure generally relates to relocating data within a data storage device having a controller and a memory device. The controller is configured to receive a command to write data to the memory device, perform toggle mode encoding on the data, and send the toggle mode encoded data to the memory device. The memory device is configured to receive the toggle mode encoded data, decode the toggle mode encoded data, and write the decoded data to a location within the memory device. The memory device is further configured to receive a read command to read data from a location within the memory device, read the data, toggle mode encode the data, and send the toggle mode encoded data to the controller. The controller is configured to receive the toggle mode encoded data, decode the toggle mode encoded data, and send the decoded data to a host device.

In one embodiment, a data storage device includes a memory device and a controller coupled to the memory device. The controller is configured to receive a command to write data to the memory device, perform toggle mode (TM) encoding on the write data, and send the TM encoded write data to the memory device. The memory device is configured to receive the TM encoded write data, decode the TM encoded write data, and write the decoded data to a location within the memory device.

In another embodiment, a data storage device includes a memory device and a controller coupled to the memory device. The memory device is configured to receive a read command to read data from a location within the memory device, read the data, toggle mode (TM) encode the data, and transmit the TM encoded read data. The controller is configured to receive the transmitted TM encoded read data, decode the TM encoded read data, and send the decoded data to a host device.

In another embodiment, a data storage device includes a memory device including means to toggle mode (TM) decode data received and means to TM encode data read. The data storage device includes a controller means coupled to the memory device. The controller means is configured to decode TM encoded data received from the memory device and TM encode write data to send to the memory device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a data storage device having a controller and a memory device. In one embodiment, the memory device comprises one or more memory dies and one or more control circuits, where each of the one or more memory dies is bonded to a respective one of the one or more control circuits. The controller is configured to receive a command to write data to the memory device, perform toggle mode encoding on the data, and send the toggle mode encoded data to the memory device. The memory device is configured to receive the toggle mode encoded data, decode the toggle mode encoded data, and write the decoded data to a location within the memory device. The memory device is further configured to receive a read command to read data from a location within the memory device, read the data, toggle mode encode the data, and send the toggle mode encoded data to the controller. The controller is configured to receive the toggle mode encoded data, decode the toggle mode encoded data, and send the decoded data to a host device.

Figure 1:
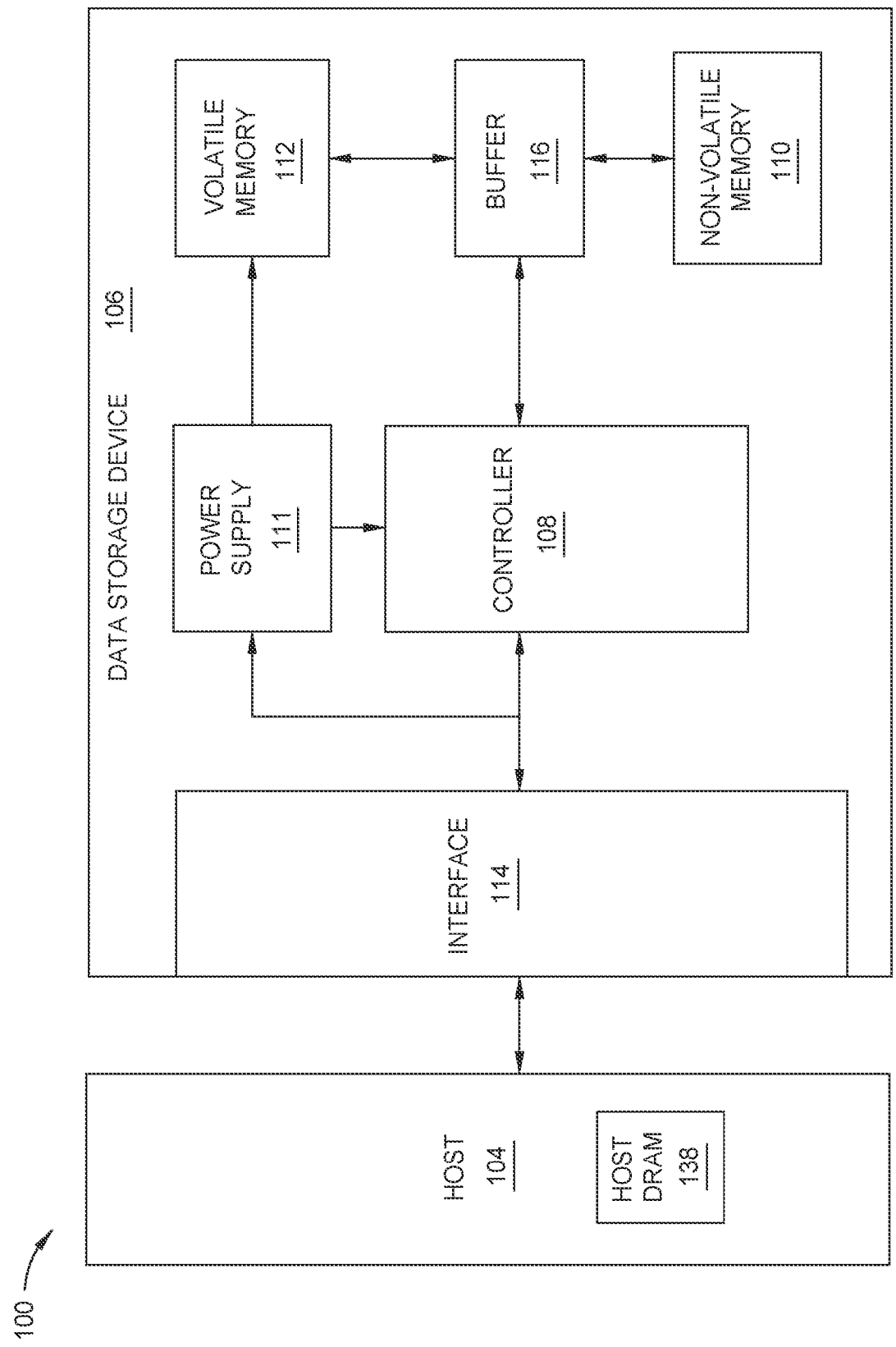
FIG. 1 is a schematic block diagram illustrating a data storage device in communication with a host device, according to certain embodiments.

FIG. 1 depicts a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106, or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe ×1, ×4, ×8, ×16, PCIe Mini Card, MiniPCI, etc.). In some examples, the data storage device 106 may be directly coupled (e.g., directly soldered or plugged into a connector) to a motherboard of the host device 104.

The interface 114 may include one or both of a data bus for exchanging data with the host device 104 and a control bus for exchanging commands with the host device 104. The interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. The interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of the interface 114 may also permit the data storage device 106 to receive power from the host device 104. For example, as illustrated in FIG. 1, the power supply 111 may receive power from the host device 104 via the interface 114.

The NVM 110 may include a plurality of memory devices or memory units. NVM 110 may be configured to store and/or retrieve data. For instance, a memory unit of NVM 110 may receive data and a message from the controller 108 that instructs the memory unit to store the data. Similarly, the memory unit may receive a message from the controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR based flash memory devices and may store data based on a charge contained in a floating gate of a transistor for each flash memory cell. In NVM flash memory devices, the flash memory device may be divided into a plurality of dies, where each die of the plurality of dies includes a plurality of blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via the interface 114. In some examples, the power supply 111 may include one or more power storage components configured to provide power to the one or more components when operating in a shutdown mode, such as where power ceases to be received from the external device. In this way, the power supply 111 may function as an on-board backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, the controller 108 may use volatile memory 112 as a cache. For instance, the controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

The controller 108 may manage one or more operations of the data storage device 106. For instance, the controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. The controller 108 may determine at least one operational characteristic of the storage system 100 and store the at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

Figure 2:
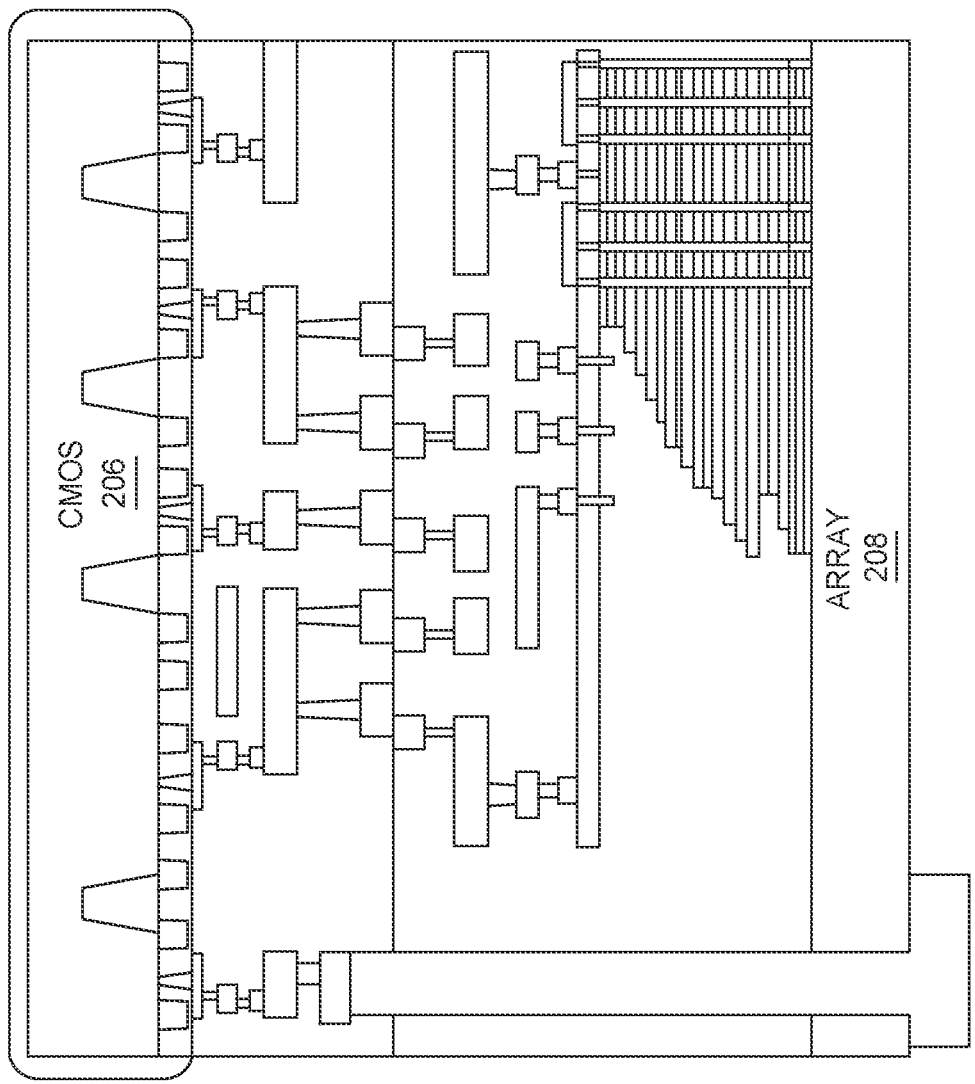
FIG. 2 is a schematic illustration of a Circuit Bounded Array (CbA) architecture, according to certain embodiments.

FIG. 2 depicts a schematic illustration of a Circuit Bounded Array (CbA) architecture 200, according to one embodiment. The CbA architecture 200 includes one or more complementary metal oxide semiconductor (CMOS) chips 206 coupled to respective one or more memory arrays 208 via one or more connection units. In one embodiment, each memory array 208 comprises a memory die.

Figure 3:
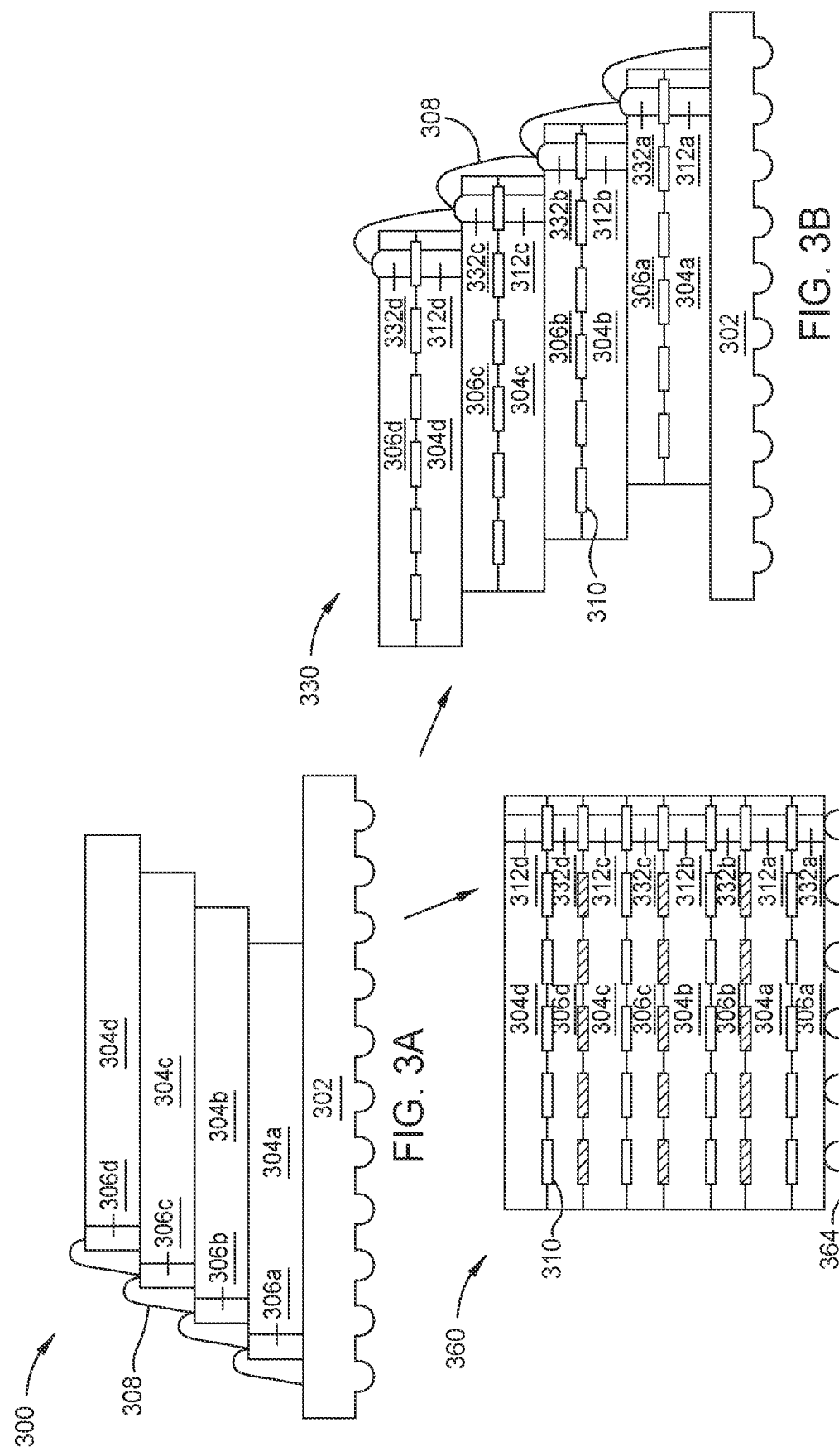
FIG. 3A is a functional diagram illustrating a CbA architecture, according to certain embodiments.
FIG. 3B is a schematic illustration of a Circuit Above Array (CAA) architecture, according to certain embodiments.
FIG. 3C is a schematic illustration of a CAA architecture, according to certain embodiments.

FIG. 3A is a functional diagram of a memory device 300 having a CbA architecture. As depicted in FIG. 3, the CbA architecture 300 includes a substrate 302, a first memory die 304a mounted on the substrate 302, a second memory die 304b stacked on the first memory die 304a, a third memory die 304c stacked on the second memory die 304b, and a fourth memory die 304d stacked on the third memory die 304c. Each of the memory dies 304a-304d is coupled to a CMOS chip. Further, each of the memory dies 304a-304d is electrically coupled to the substrate either directly or by way of a respective one of the CMOS chips. It is to be understood that the number of arrays and CMOS chips depicted are not intended to be limiting, but to provide an example of a possible embodiment.

For example, the first memory die 304a is coupled to a first CMOS chip 306a, where the first CMOS chip 306a is also coupled to the substrate 302. The second memory die 304b is coupled to a second CMOS chip 306b, where the second CMOS chip 306b is also coupled to the first CMOS chip 306a. The third memory die 304c is coupled to a third CMOS chip 306c, where the third CMOS chip 306c is also coupled to the second CMOS chip 306b. The fourth memory die 304d is coupled to a fourth CMOS chip 306d, where the fourth CMOS chip 306d is also coupled to the third CMOS chip 306c.

A bond wire 308 may be used to couple the first CMOS chip 306a to the substrate, the second CMOS chip 306b to the first CMOS chip 306a, the third CMOS chip 306c to the second CMOS chip 306b, and the third CMOS chip 306c to the fourth CMOS chip 306d. The bond wire 308 may comprise one or more bond wires.

FIG. 3B depicts a schematic illustration of a memory device 330 having a Circuit Above Array (CAA) architecture, according to certain embodiments. The reference numerals of the memory device 300 may be used in the description of similar components of the CAA architecture memory device 330. In the CAA architecture, a CMOS chip is bonded above a memory die. It is to be understood that the number of memory dies and CMOS chips depicted is not intended to be limiting, but to provide an example of a possible embodiment.

For example, the first memory die 304a is disposed on the substrate 302 and the first CMOS chip 306a is bonded to the first array 304a. As used herein, bonded means that active surface of the CMOS chip 306a is in direct contact both electrically and mechanically with the active surface of the first memory die 304a. The second memory die 304b is partially disposed on the inactive surface of the first CMOS chip 306a and the second CMOS chip 306b is bonded to the second memory die 304*b*. The third memory die 304*c* is partially disposed on the inactive surface of the second CMOS chip 306*b* and the third CMOS chip 306*c* is bonded to the third memory die 304*c*. The fourth memory die 304*d* is partially disposed on the inactive surface of the third CMOS chip 306*c* and the fourth CMOS chip 306*d* is bonded to the fourth memory die 304*d*.

In the embodiment shown, the first CMOS chip 306*a* includes a first through-silicon-via (TSV) 332*a*. The second CMOS chip 306*b* includes a second TSV 332*b*. The third CMOS chip 306*c* includes a third TSV 332*c*. The fourth CMOS chip 306*d* includes a fourth TSV 332*d*. Each of the TSVs 332*a*-332*d* are coupled to the bond wire 308. Each memory die 304*a*-304*d* includes a respective TSV 312*a*-312*d*. The first memory die 304*a* includes a first TSV 312*a*, the second memory die 304*b* includes a second TSV 312*b*, the third memory die 304*c* includes a third TSV 312*c*, and the fourth memory die 304*d* includes a fourth TSV 312*d*. In some embodiments, one or more bonding pads 310 are disposed between each memory die/CMOS chip pair.

FIG. 3C depicts a schematic illustration of a memory device 360 having a Circuit Under the Array (CUA) architecture, according to certain embodiments. The reference numerals of the CbA architecture memory device 300 and the CAA architecture memory device 330 may be used in the description of similar components of the CUA architecture memory device 360. In the CUA architecture, the CMOS chips 306*a*-306*d* are bonded under the memory dies 304*a*-304*d*. As with FIGS. 3A and 3B, it is to be understood that the number of memory dies and CMOS chips depicted are not intended to be limiting, but to provide an example of a possible embodiment.

In the embodiment shown in FIG. 3C, the pairs of memory dies and CMOS chips 304*a*-304*d*/306*a*-306*d* are stacked vertically without successive pairs partially overhanging the substrate 302. In addition, the pairs of memory dies and CMOS chips are electrically connected by way of TSVs instead of with bond wires (as in FIG. 3A) or a combination of bond wires and TSVs (FIG. 3B). Further, the first CMOS chip 306*a* is disposed mounted on the substrate 302 and connected to the substrate with a plurality of solder balls 364. As will be apparent, according to the CbA architecture, whether it is CAA or CUA, each memory die is coupled to a CMOS die and thus has its own control logic circuitry and therefore data to be stored in the memory die may be manipulated by its associated CMOS logic circuitry.

Figure 4:
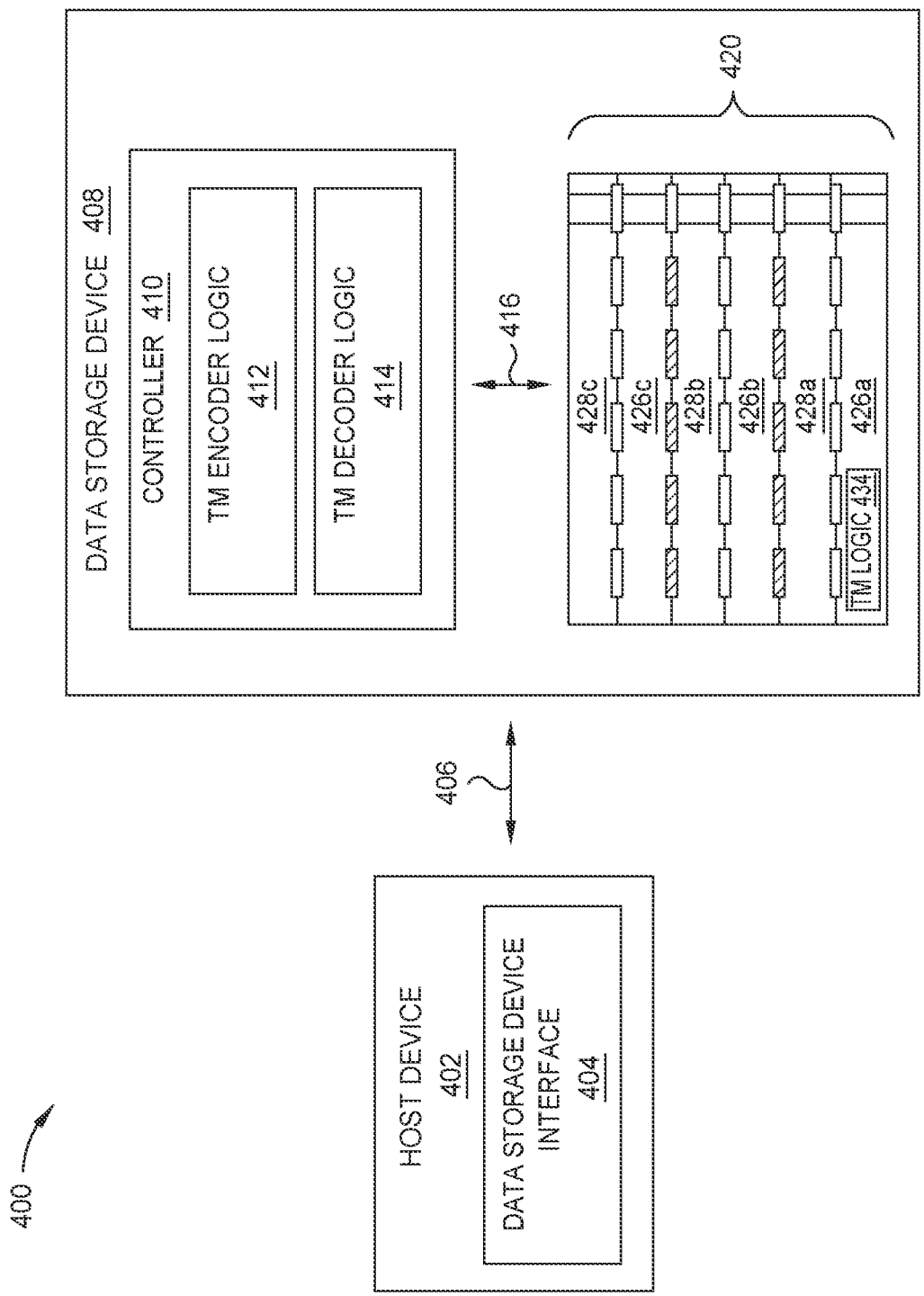
FIG. 4 is a schematic block diagram illustrating a data storage device coupled to a host system where the data storage device includes a circuit bounded array architecture, according to certain embodiments.

FIG. 4 is a schematic block diagram illustrating a storage system 400 in which a host device 402 is coupled to a data storage device 408 by way of a flash bus 406. The data storage device 408 includes a controller 410 coupled to a memory array 420 by way of a memory bus 416. The memory array 420 in the embodiment shown is a CUA architecture similar to that depicted in FIG. 3C, where CMOS logic chips 426*a*-426*c* are bonded to respective memory dies 428*a*-428*c*.

The host device and the data storage device 408 communicate by way of the flash bus 406. The flash bus 406 may be utilized to transfer data and commands between the data storage device 408 and the host device 402. The host device 402 includes a data storage device interface 404 that may be configured to manage the ingress and egress of data to and from the data storage device 408.

The controller 410 of the data storage device 408 includes toggle mode (TM) encoder logic 412 and TM decoder logic 414. The TM encoder logic 412 may be configured to encode data to be stored in a location of the memory array 420 and the TM decoder logic 414 may be configured to decode encoded data retrieved from the memory array 420. Data is transferred between the controller 410 and the memory array 420 by way of the memory bus 416.

Each of the CMOS chips 426*a*-426*c* includes its own TM logic circuit 434. The TM logic 434 may be configured to encode data to be transferred from the memory array 420 to the controller 410 and decode data transferred from the controller 410 to the memory array 420.

In a write process the TM encoder logic 412 encodes data that is then transferred to the memory array 420 via the memory bus 416, and the TM logic 434 at the relevant CMOS chip decodes the encoded data. Likewise, when read data is transferred from the memory array 420 to the controller 410 via the memory bus 416, the data is encoded by the TM logic 434 after being read from the memory die of the array and then decoded by the TM decoder logic 414 of the controller 410. In one embodiment, the TM encoder logic 412 and the encoding performed by the TM logic 434 may use the same encoding mapping, such that the encoding is symmetric. In another embodiment, the TM encoder logic 412 and the encoding performed by the TM logic 434 may utilize different encoding mapping, such that the encoding is asymmetric. Likewise, in one embodiment, the TM decoder logic 414 and the decoding performed by the TM logic 434 may use the same decoding mapping, such that the decoding is symmetric. In another embodiment, the TM decoder logic 414 and the decoding performed by the TM logic 434 may use different decoding mapping, such that the decoding is asymmetric.

The TM encoder logic 412 and the TM logic 434 may be configured to encode the data in such a way to reduce the number of switches from 1s to 0s and vice-versa that are applied to the data during data shaping. By reducing and even minimizing the number of bit switches, the termination power may be reduced. The dedicated TM logic 434 is configured to decode the encoded data and program the decoded data to the appropriate location of the memory array. By including the TM logic 434, the silicon area may be saved, such that less silicon area is utilized, and processing power of data storage device 408 by virtue of the CbA may be more effectively utilized or have greater power saving.

The encoding and the decoding by the TM encoder logic 412, the TM decoder logic 414, and the TM logic 434 may be dynamically calibrated according to an analysis of the interface transmission line and one or more parasitic elements of the interface transmission line. The one or more parasitic elements includes, but is not limited to, TM frequency rate, amount of NAND dies in the memory array stack, the type of PCB utilized, the packaging parameters, and the resulting delay and impedance. The dynamic calibration may be based on a short term history, such as the previous "x" amount of transactions or "y" amount of time. By dynamically calibrating the encoding and decoding logic, the amount of switching between individual wires may be reduced, such as the flips from 1 to 0 and vice-versa, the amount of polarity switching between adjacent wires may be reduced which may decrease the amount of power loss due to cross talk, and the amount of DC power spent on target terminations by shifting data polarity distributions may be reduced. For example, a greater number of 0s may be preferred in case of a low voltage swing termination logic (LVSTL) interfaces that have a termination coupled to the ground or transfer a greater number of 1s in the case of pseudo open drain (POD) interfaces that have a termination coupled to the Vcc. Furthermore, the encoding of data being transferred between the controller 410 and the memory array 420 may lead to improved data integrity as the data is encoded and protected.

The interface coding, such as the TM encoder logic 412 and the TM logic 434, may include additional redundancy logic. The additional redundancy logic may include utilization of control data signals such as data bus inversion (DBI), encoding control signals during data transfers, additional data cycles, and additional data signals on top of the 8-bit NAND data bus. It is contemplated that other redundancy logic may be applicable to the embodiments described.

Figure 5:
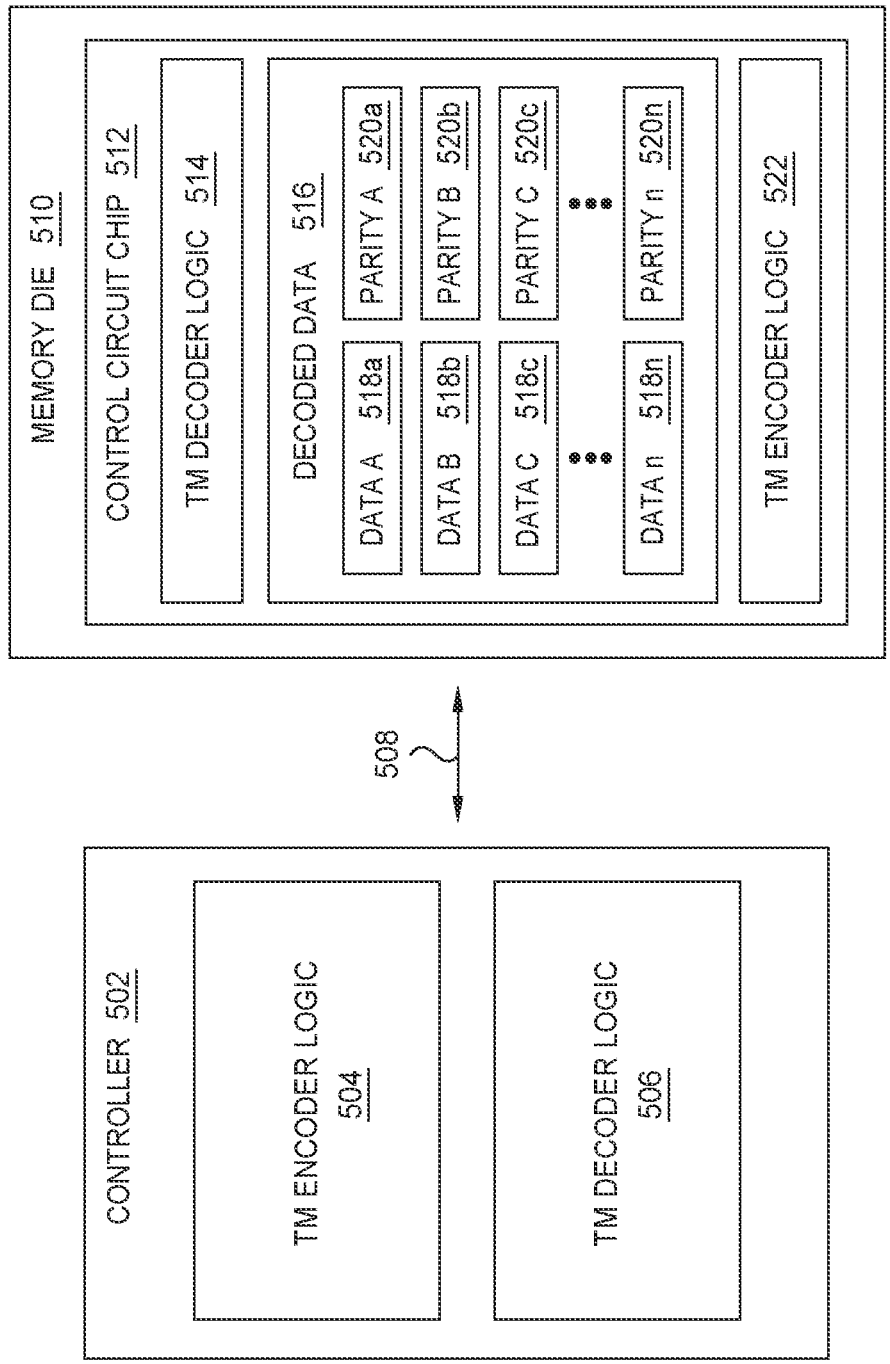
FIG. 5 is a schematic illustration of a memory controller and CbA memory device, each including TM encoder logic and TM decoder logic, according to certain embodiments.

FIG. 5 depicts a schematic illustration of a memory controller 502 of a memory device coupled to a memory die 510 by way of a memory bus 508, where each of the controller 502 and the memory die 510 include TM encoder logic 504, 522 and TM decoder logic 506, 514, according to certain embodiments. The controller 502 includes the TM encoder logic 504 and the TM decoder logic 506. The memory die 510 includes a control circuit chip 512, which may be a CMOS chip of the CbA architectures 300, 330, 360, 420 of FIGS. 3A-3C and FIG. 4. The control circuit chip 512 includes the TM decoder logic 514, the TM encoder logic 522, and a decoded data section 516. The decoded data section 516 includes a plurality of data registers 518a-518n and a plurality of parity data registers 520a-520n, where each parity data register is associated with one of the plurality of data registers 518a-518n. Encoded data is transferred between the controller 502 and the memory die 510 via the memory bus 508.

Figure 6:
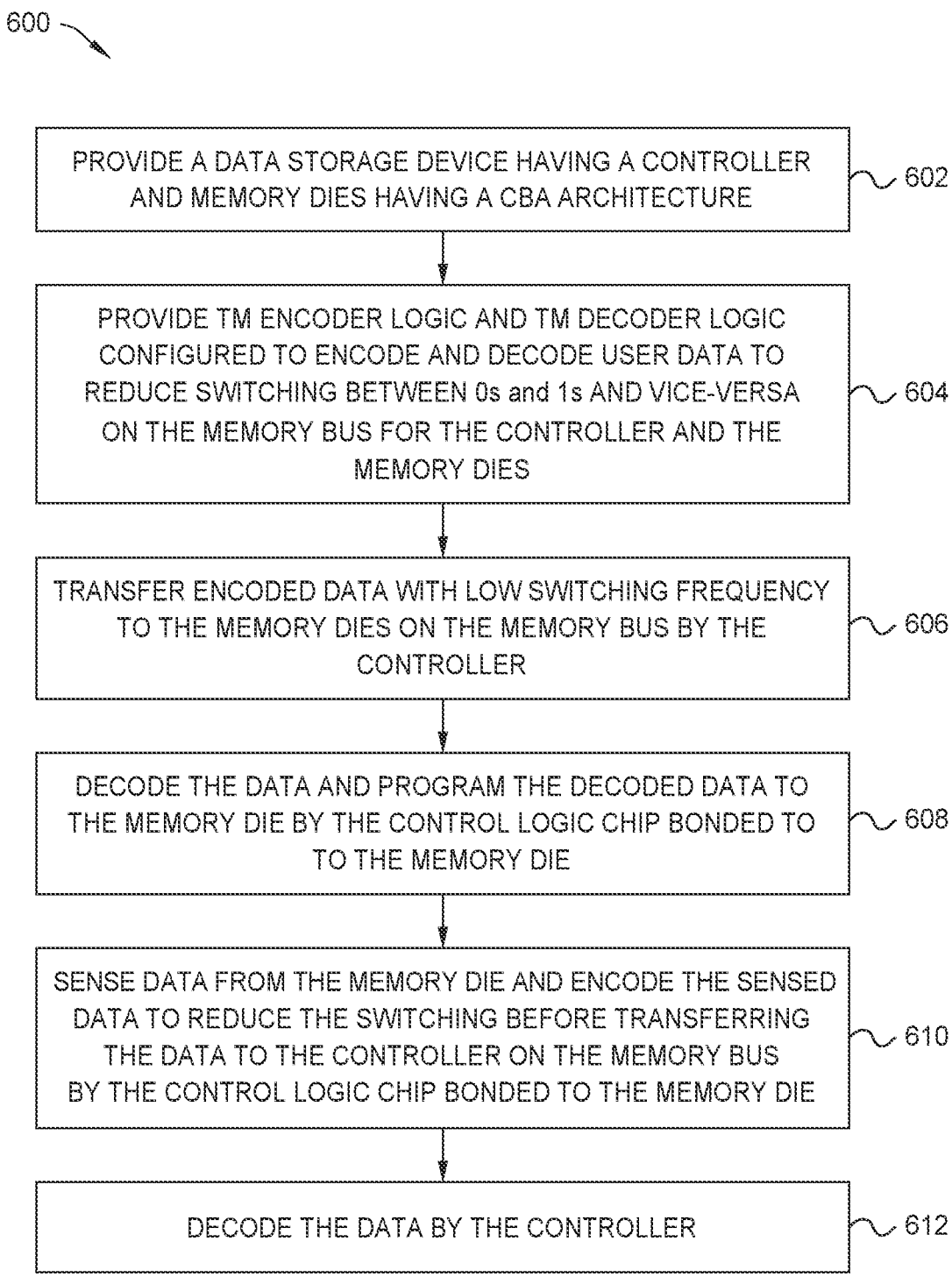
FIG. 6 is a flow diagram illustrating a method of toggle mode coding, according to certain embodiments.

FIG. 6 is a flow diagram illustrating a method 600 of toggle mode coding, according to certain embodiments. The method 600 may be utilized by the TM logic, such as the TM encoder logic 412, 504, 522, the TM decoder logic 414, 506, 514, or the TM logic 434 of FIGS. 4 and 5. At block 602, a data storage device that includes at least one memory die and at least one control circuit chip coupled to the one memory die is provided. For example, the data storage device may be the data storage device 408 of FIG. 4, where the at least one memory die and the at least one control circuit chip may be the memory array 420 of FIG. 4 or the memory die 510/control circuit chip 512 of FIG. 5.

At block 604, TM encoder logic and TM decoder logic configured to encode and decode, respectively, user data in order to reduce and preferably minimize switching between 0s and 1s (and vice-versa) on the memory bus between the controller and the at least one memory dies is provided. At block 606, the TM encoder of the controller encodes data and transfers the encoded data with a low switching frequency via the memory bus from the controller to the at least one memory dies. The controller may be controller 502 of FIG. 5. At block 606, the controller may be executing a write command received from a host device or writing data back to the memory device as part of a data management operation. At block 608, the TM decoder logic of the at least one control circuit chip bonded to the memory die decodes the received encoded data and the decoded data is programmed to a target location of the memory die.

At block 610, when a read command is received or a data management operation, such as garbage collection, occurs, the data is sensed from the relevant location of the memory die and encoded by the TM encoder logic of the at least one control circuit chip bonded to the memory die. The encoding is completed before transferring the data to the controller via the memory bus. At block 612, the encoded data is decoded by the TM decoder logic of the controller.

Figure 7:
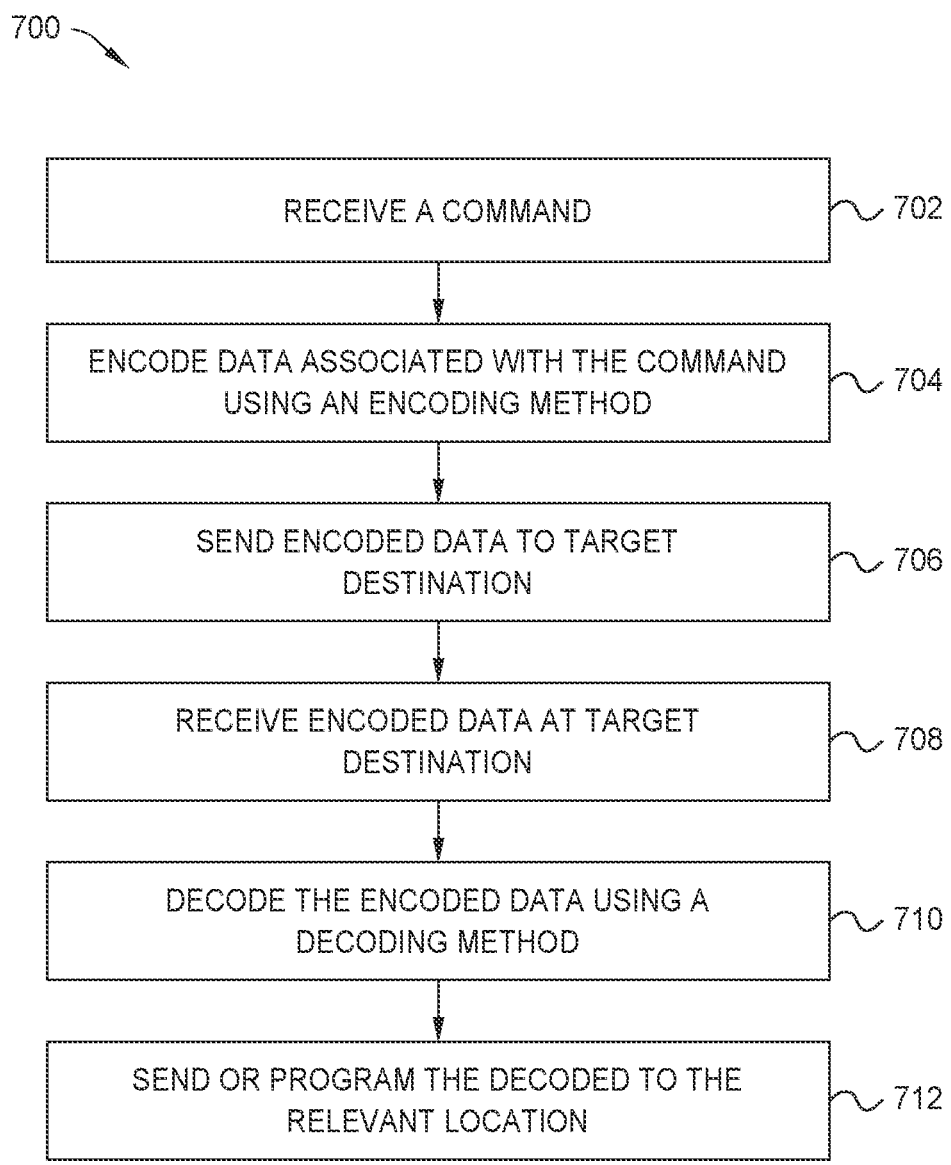
FIG. 7 is a flow diagram illustrating a method of transferring data between a memory controller and respective memory dies, according to certain embodiments.

FIG. 7 is a flow diagram illustrating a method 700 of transferring data between a memory controller (as opposed to a host controller), such as the controller 502 of FIG. 5, and a respective memory device, such as the memory die 510 and control circuit chip 512 of FIG. 5, according to certain embodiments. At block 702, a command is received by the memory controller. The received command may be a write command received from a host device or an internal write command to write data back to a location of the memory device as part of a data management operation. At block 704, the data is encoded by the TM encoder logic of the controller utilizing a first encoding method. At block 706, the encoded data is transferred via a memory bus to the memory device. At block 708, the encoded data is received at the memory device. At block 710, the TM decoder logic of the circuit chip decodes the encoded data utilizing a first decoding method. At block 712, the decoded data is programmed to the relevant location of the memory device.

The method 700 may also be applicable in the reverse. For example, at block 704, rather than the TM encoder logic of the controller encoding data, the TM encoder logic of the circuit chip encodes the relevant data using a second encoding method. The relevant data is sent back to the controller at block 706, where the TM decoder logic of the controller decodes the data utilizing a second decoding method at block 710. In one embodiment, the first encoding method and the second encoding method are substantially the same. In another embodiment, the first encoding method and the second encoding method are substantially different. In one embodiment, the first decoding method and the second decoding method are substantially the same. In another embodiment, the first decoding method and the second decoding method are substantially different.

By implementing circuit-bounded-array architectures with TM coding (encoding and decoding) logic, power consumption of the data storage device during device operations may be reduced and the bit error rate (BER) may be decreased due to fewer communication errors. Furthermore, the CbA architectures with TM coding logic may improve the transfer signal integrity with high TM frequency.

In one embodiment, a data storage device includes a memory device and a controller coupled to the memory device. The controller is configured to receive a command to write data to the memory device, perform toggle mode (TM) encoding on the write data, and send the TM encoded write data to the memory device. The memory device is configured to receive the TM encoded write data, decode the TM encoded write data, and write the decoded data to a location within the memory device.

The memory device includes a memory die and a control circuit chip. The control circuit chip and the memory die are configured in a CbA architecture. The control circuit chip includes logic configured to perform TM decoding on the data. The controller is further configured to receive TM encoded data from the memory device and decode the TM encoded data. The memory device is further configured to TM encode data read from a memory die and send the TM encoded data to the controller. The TM encoding performed at the controller and the TM encoding performed at the memory device may be either symmetric or asymmetric. The data storage device further includes a bus between the memory device and the controller for passing the TM encoded read and write data therebetween.

In another embodiment, a data storage device includes a memory device. The memory device is configured to receive a read command to read data from a location within the memory device, read the data, toggle mode (TM) encode the data, and transmit the TM encoded data. The data storage device includes a memory controller coupled to the memory device. The memory controller is configured to receive the transmitted TM encoded read data, decode the TM encoded read data, and send the decoded data to a host device.

The memory device includes a control chip containing logic to perform the TM encoding. The control chip additionally includes logic to perform TM decoding. The controller includes logic to perform the TM decoding and logic to perform TM encoding. The TM encoding performed by the controller may be different from the TM encoding performed by the memory device. The memory device is configured to receive TM encoded data, decode the TM encoded data, and write decoded data to a location in the memory device. The controller is configured to receive a write request for data, TM encode the write data, and send the TM encoded write data to the memory device. The data sent from the controller to the memory device and data received at the controller from the memory device is TM encoded.

In another embodiment, a data storage device includes a memory device including means to toggle mode (TM) decode data received and means to TM encode data read. The data storage device includes a controller means coupled to the memory device. The controller means is configured to decode TM encoded data received from the memory device and TM encode write data to send to the memory device.

The memory device includes a memory die having a control circuit die bonded thereto. The control circuit die is configured to read decoded data from the memory die and write decoded data to the memory die.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device comprising a plurality of complementary metal oxide semiconductor (CMOS) chips and a plurality of memory dies, wherein each CMOS chip of the plurality of CMOS chips are coupled to one or more memory dies of the plurality of memory dies; and
a controller coupled to the memory device, wherein the controller is configured to:
dynamically calibrate a toggle mode (TM) encoder of the controller, wherein dynamically calibrating the TM encoder of the controller optimizes and reduces an average power usage over a transmission line from the controller to a CMOS chip; and
transfer encoded data from the controller to the memory device; wherein each CMOS chip of the plurality of CMOS chips is configured to:
dynamically calibrate a TM encoder of a CMOS chip coupled to a memory die; and
transfer encoded data from the memory die to the controller based on the dynamically calibrated TM encoder of the CMOS chip.

2. The data storage device of claim 1, wherein dynamically calibrating the TM encoder of the controller comprises causing the TM encoder of the controller to decrease a number of switches from 1-bits to 0-bits while encoding the data.

3. The data storage device of claim 1, wherein dynamically calibrating the TM encoder of the controller comprises causing the TM encoder of the controller to decrease a number of switches from 0-bits to 1-bits while encoding the data.

4. The data storage device of claim 1, wherein dynamically calibrating the TM encoder of the CMOS chip comprises causing the TM encoder of the CMOS chip to decrease a number of switches from 1-bits to 0-bits while encoding the data.

5. The data storage device of claim 1, wherein dynamically calibrating the TM encoder of the CMOS chip comprises causing the TM encoder of the CMOS chip to decrease a number of switches from 0-bits to 1-bits while encoding the data.

6. The data storage device of claim 1, wherein dynamically calibrating of the TM encoder of the controller or the TM encoder of the CMOS chip comprises causing the TM encoder of the controller or the TM encoder of the CMOS chip to flip a number of 0-bits to 1-bits transmitted over the transmission line.

7. The data storage device of claim 6, wherein the flipping a number of 0-bits to 1-bits over the transmission line is in response to pseudo open drain (POD) interfaces that have a termination coupled to a voltage common collector (Vcc).

8. The data storage device of claim 1, wherein dynamically calibrating of the TM encoder of the controller or the TM encoder of the CMOS chip comprises causing the TM encoder of the controller or the TM encoder of the CMOS chip to flip a number of 1-bits to 0-bits transmitted over the transmission line.

9. The data storage device of claim 8, wherein the flipping a number of 0-bits to 1-bits over the transmission line is in response to low voltage swing termination logic (LVSTL) interfaces that have a termination coupled to a ground.

10. The data storage device of claim 1, wherein dynamically calibrating of the TM encoder of the controller or the TM encoder of the CMOS chip comprises causing the TM encoder of the controller or the TM encoder of the CMOS chip to reduce an amount of polarity switching of 1-bits to 0-bits or 0-bits to 1-bits between adjacent transmission lines.

11. A data storage device, comprising:
a memory device comprising a plurality of complementary metal oxide semiconductor (CMOS) chips and a plurality of memory dies, wherein each CMOS chip of the plurality of CMOS chips are coupled to one or more memory dies of the plurality of memory dies; and
a controller coupled to the memory device, wherein the controller is configured to:
toggle mode (TM) encode data being sent to the memory device, wherein the TM encoding data being sent to the memory device comprises changing a number of bits of the data from 1-bits to 0-bits or from 0-bits to 1-bits based on an analysis of an interface transmission line and one or more parasitic elements of the interface transmission line;
wherein a CMOS chip of the plurality of CMOS chips is configured to:
toggle mode (TM) encode data being sent to the controller from a coupled memory die, wherein the TM encoding data being sent to the controller comprises changing a number of bits of the data from 1-bits to 0-bits or from 0-bits to 1-bits based on an analysis of an interface transmission line and one or more parasitic elements of the interface transmission line.

12. The data storage device of claim 11, wherein the analysis of the interface transmission line comprises determining an amount of polarity switching between adjacent transmission lines.

13. The data storage device of claim 11, wherein the analysis of the interface transmission line determining whether the interface transmission line terminates at a voltage common collector (VCC) or at a ground.

14. The data storage device of claim 13, wherein the TM encoding, by the controller or the CMOS chip, comprises changing the number of bits of the data from 0-bits to 1-bits when the interface transmission line terminates at the VCC, and wherein a number of 1-bits is greater than a number of 0-bits.

15. The data storage device of claim 13, wherein the TM encoding, by the controller or the CMOS chip, comprises changing the number of bits of the data from 1-bits to 0-bits when the interface transmission line terminates at the ground, and wherein a number of 0-bits is greater than a number of 1-bits.

16. The data storage device of claim 11, wherein the CMOS chip is either:
    circuit bounded array (CBA);
    circuit under array (CuA); or
    circuit above array (CAA).

17. The data storage device of claim 11, wherein the controller comprises a first TM encoder configured to TM encode the data being sent to the memory device, and wherein the CMOS chip comprises a second TM encoder configured to TM encode the data being sent to the controller from the coupled memory die.

18. The data storage device of claim 17, wherein the TM encoding by the first TM encoder is different than the TM encoding by the second TM encoder.

19. A data storage device, comprising:
    memory means configured to:
        toggle mode (TM) encode data to send to a controller coupled to the memory means, wherein TM encoding data to send to the controller coupled to the memory means comprises dynamically calibrating a TM encoder of the memory means to optimize and reduce an average power usage over a transmission line from the memory means to the controller coupled to the memory means; and
    the controller coupled to the memory means, wherein the controller is configured to:
        toggle mode (TM) encode data to send to the memory means, wherein TM encoding data to send to the memory means comprises dynamically calibrating a TM encoder of the controller to optimize and reduce an average power usage over a transmission line from the controller to the memory means.

20. The data storage device of claim 19, wherein TM encoding data to send to the controller and TM encoding data to send to the memory means comprises switching 1-bits to 0-bits or 0-bits to 1-bits based on:
    reducing an amount of switching of bits from 1-bits to 0-bits or 0-bits to 1-bits;
    reducing an amount of polarity switching between adjacent transmission lines; and
    reducing an amount of direct current (DC) power spent on terminations by shifting bit distribution of 1-bits and 0-bits based on whether the termination is at a voltage common collector or at a ground.

* * * * *